(12) United States Patent
Ueki et al.

(10) Patent No.: US 7,342,666 B2
(45) Date of Patent: Mar. 11, 2008

(54) METHOD AND APPARATUS FOR MEASURING HOLDING DISTORTION

(75) Inventors: Nobuaki Ueki, Saitama (JP); Koji Otsuka, Yokohama (JP)

(73) Assignees: Fujinon Corporation, Saitama (JP); Asahi Glass Company, Ltd., Tokyo (JP)

( * ) Notice: Subject to any disclaimer, the term of this patent is extended or adjusted under 35 U.S.C. 154(b) by 289 days.

(21) Appl. No.: 11/258,955

(22) Filed: Oct. 27, 2005

(65) Prior Publication Data
US 2006/0126077 A1 Jun. 15, 2006

(30) Foreign Application Priority Data
Oct. 29, 2004 (JP) ............... P.2004-316788

(51) Int. Cl.
G01B 11/02 (2006.01)
G01L 1/24 (2006.01)
(52) U.S. Cl. ........................ 356/512; 73/800
(58) Field of Classification Search ........ 356/489, 356/495, 511–514; 73/800
See application file for complete search history.

(56) References Cited

U.S. PATENT DOCUMENTS

| | | | | |
|---|---|---|---|---|
| 3,715,915 | A * | 2/1973 | Williams | 73/800 |
| 6,826,491 | B2 * | 11/2004 | Jachim | 702/42 |
| 6,992,779 | B2 * | 1/2006 | Ueki | 356/512 |
| 2002/0066310 | A1 * | 6/2002 | Jachim | 73/159 |
| 2004/0141184 | A1 * | 7/2004 | Ueki | 356/497 |
| 2006/0066874 | A1 * | 3/2006 | Ueki | 356/512 |
| 2006/0139656 | A1 * | 6/2006 | Kulawiec et al. | 356/512 |

FOREIGN PATENT DOCUMENTS

| | | |
|---|---|---|
| JP | 9-21606 A | 1/1997 |
| JP | 9-203619 A | 8/1997 |
| JP | 9-306832 A | 11/1997 |
| JP | 10-260037 A | 9/1998 |
| JP | 2000-223414 A | 8/2000 |
| JP | 2004-037165 A | 2/2004 |
| JP | 2004-510958 A | 4/2004 |

OTHER PUBLICATIONS

Kazuo Hotate et al., Proceedings of Light Wave Sensing, May 1995, pp. 75-82.

* cited by examiner

*Primary Examiner*—Patrick Connolly
(74) *Attorney, Agent, or Firm*—Birch, Stewart, Kolasch & Birch, LLP

(57) ABSTRACT

There are carried out a first measurement operation for measuring the shape of a front surface of a sample held in a held state, a second measurement operation for measuring the shape of a back surface of the sample held in the same state, and a third measurement operation for measuring the shape of the back surface of the sample held so as to cause inverse distortion. First data are acquired on the basis of the front surface shape data obtained through the first measurement operation and the back surface shape data obtained through the second measurement operation. Second data are obtained on the basis of the front surface shape data obtained through the first measurement operation and the back surface shape data obtained through the third measurement operation. Holding distortion is determined on the basis of the first and second data.

6 Claims, 8 Drawing Sheets

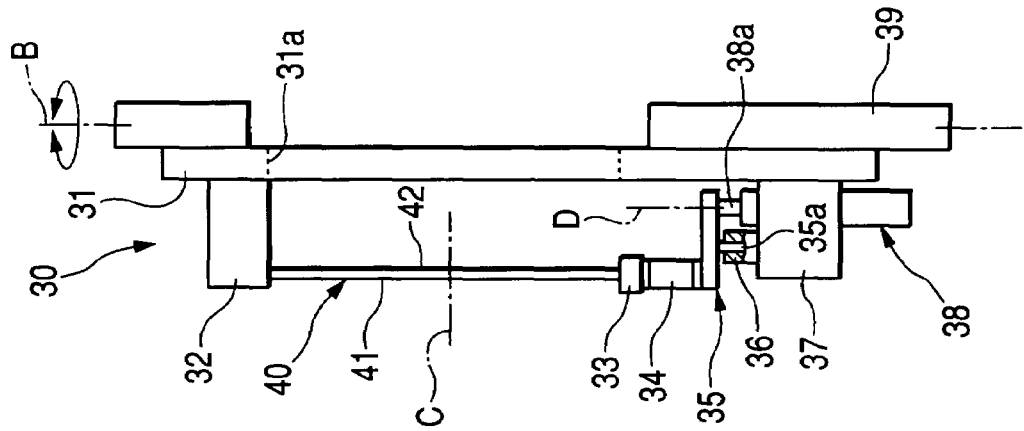
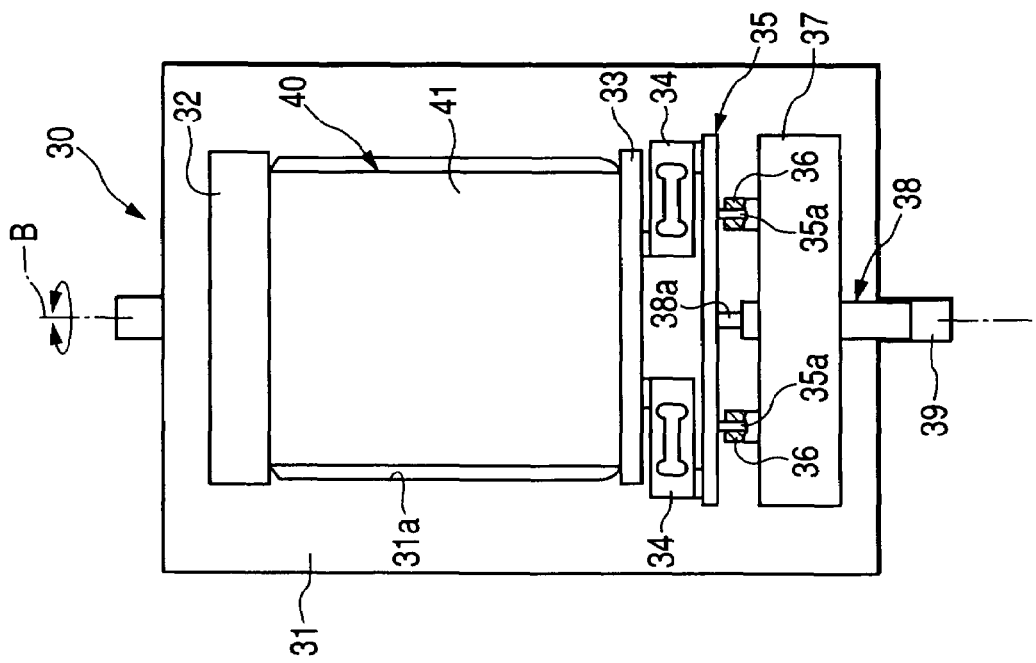

METHOD AND APPARATUS FOR MEASURING HOLDING DISTORTION

FIELD OF THE INVENTION

The present invention relates to a method and an apparatus for measuring a surface shape of an optical member, or the like, by use of an interferometer Particularly, the present invention relates to a holding distortion measurement method and a holding distortion measurement apparatus, which measure, when a plate-like sample is held in a held state, distortions having arisen in the sample as a result of the held state thereof.

BACKGROUND OF THE INVENTION

During a process of manufacturing a semiconductor, there has hitherto been used a photomask for use in transferring a circuit pattern onto a semiconductor wafer through exposure. A photomask of this type is usually used for exposure while being held such that a mask surface of the photomask is made substantially horizontal (or such that the normal line of the mask surface is oriented essentially in the direction of gravity). In order to enable accurate transfer, consideration must be given to preventing the mask surface from being bent under the influence of gravity or the like. With this being the case, various proposals have hitherto been put forth in connection with a holding method for retaining planarity of the photomask during exposure (see JP-A-9-306832 and JP-A-2000-223414).

When optical performance of the photomask, such as profile irregularity or a distribution of refractivity, is measured, consideration is given to holding a photomask in an upright position so as to minimize influence of gravity (i.e., in a position where the normal line of the photomask surface becomes essentially perpendicular to the direction of gravity). Minimizing the load, which must be exerted on said photomask for maintaining the above-arranged photomask still, to thus prevent occurrence of distortions in the sample is desirable.

However, even when the photomask is held in an arbitrary position, there still exists a possibility of occurrence of distortions, such as deflections, attributable to the held state of the photomask, so long as gravity or the load used for holding the photomask acts on the photomask.

From a technical standpoint, complete elimination of distortions attributable to such a held state is extremely difficult. Moreover, a technique for measuring such distortions while the distortions are isolated from the surface shape of the photomask has hitherto been unknown Therefore, in a related-art measurement technique, distortions attributable to a held state are unavoidably superimposed on the measurement result of a surface shape of the photomask. Extreme difficulty is encountered in high-precision measurement of a surface shape in such a distortion-free state.

SUMMARY OF THE INVENTION

An object of an illustrative, non-limiting embodiment of the present invention is to provide a holding distortion measurement method and a holding distortion measurement apparatus, which enable measurement, when a plate-like sample such as a photomask is held in a held state, of a shape of a sample surface while distortions having arisen in the sample due to the held state thereof are isolated from the shape.

According to the present invention, in order to achieve the above-described object, a plurality of measurements is conducted. Measurements includes a measurement operation which is performed such that distortion (called "inverse distortion" in the present invention), which is opposite in direction and essentially equal in the amount to distortion arising in a sample due to a held state; namely, distortion, deformation, or deflection (all of which are called "holding distortions" in the present invention), arises in the sample by means of changing the held state of the sample. The holding distortion can be measured separately from the shape of a sample surface on the basis of the obtained measurement data.

Specifically, a holding distortion measurement method of the present invention is a method for measuring a holding distortion arising in a plate-like sample due to a held state thereof when the plate-like sample is held in the held state, the method including:

a first measurement operation for measuring a front surface shape of the sample held in the held state;

a second measurement operation for measuring a back surface shape of the sample held in the held state;

a third measurement operation for measuring the front or back surface shape while the sample is held in such a way that inverse distortion arises in the sample, in which a deformation orientation of the inverse distortion is opposite that of the holding distortion, and a deformation amount of the inverse distortion is substantially equal to that of the holding distortion;

obtaining first data pertaining to a variation in thickness of the sample on the basis of front surface shape data obtained through the first measurement operation and back surface shape data obtained through the second measurement operation;

obtaining second data by superimposing data of the holding distortion and data of the inverse distortion on data of the variation in thickness, on the basis of the front surface shape data obtained through the first measurement operation and back surface shape data obtained through the third measurement operation, or on the basis of the back surface shape data obtained through the second measurement operation and front surface shape data obtained through the third measurement operation; and determining the holding distortion arising in the sample due to the held state on the basis of the first data and the second data.

Regarding the relationship between the distortion (holding distortion) and the inverse distortion, provided that one deforms the front surface of the sample into a recessed shape and the back surface of the same into a protuberant shape, the above phrase "inverse distortion in which a deformation orientation of the inverse distortion is opposite that of the distortion, and a deformation amount of the inverse distortion is substantially equal to that of the distortion" means that the other deforms the front surface into a protuberant shape and deforms the back surface into a recessed shape; and that the amount (absolute value) of deformation of the distortion is essentially equal to the amount of deformation of the inverse distortion.

The terms "front surface" and the "back surface," which are used in the present invention, denote one surface and the other surface of two mutually-opposing surfaces of a sample.

Moreover, the ordinal numbers assigned to the "first measurement operation," the "second measurement operation," and the "third measurement operation" are used merely for the purpose of distinguishing the measurement operations from each other, and are not intended to limit a sequence in which measurement is to be carried out. Specifically, arbitrary numbers can be selected for the sequence in which measurement is to be carried out.

The front surface shape, which is free from the holding distortion, may be determined on the basis of the determined holding distortion and the front surface shape data obtained through the first measurement operation.

A holding distortion measurement apparatus of the present invention is an apparatus for measuring a holding distortion arising in a plate-like sample due to a held state thereof when the sample is held in the held state, the apparatus including:

shape measurement means for carrying out a first measurement operation for measuring a front surface shape of the sample held in the held state along an optical axis of a measurement beam (optical measurement axis), a second measurement operation for measuring a back surface shape of the sample held in the held state along the optical axis of the measurement beam, and a third measurement operation for measuring the front or back surface shape while the sample is held along the optical axis of the measurement beam and held in such a way that inverse distortion arises in the sample, in which a deformation orientation of the inverse distortion is opposite that of the distortion, and a deformation amount of the inverse distortion is substantially equal to that of the distortion; and analysis means for obtaining first data pertaining to a variation in thickness of the sample on the basis of front surface shape data obtained through the first measurement operation and back surface shape data obtained through the second measurement operation, obtaining second data by superimposing data of the holding distortion and data of the inverse distortion on data of the variation in thickness, on the basis of the front surface shape data obtained through the first measurement operation and the back surface shape data obtained through the third measurement operation, or on the basis of the back surface shape data obtained through the second measurement operation and the front surface shape data obtained through the third measurement operation, and determining the holding distortion arising in the sample due to the held state, on the basis of the first data and the second data.

The holding distortion measurement apparatus of the present invention may farther include:

holding means configured to be able to hold the sample along the optical axis of the measurement beam and to invert an orientation of the plate-like sample with respect to the shape measurement means while the plate-like sample is maintained in the held state.

The shape measurement means may further include an interference optical system capable of acquiring an interference fringe carrying wave surface information about a surface of the sample by radiating an outgoing beam from a light source onto a reference surface and a sample surface of the plate-like sample held along the optical axis of the measurement beam so as to cause interference between light returning from the reference surface and light returning from the sample surface.

At that time, when the sample is a transparent parallel plate such as a photomask, a low coherent light source, in which the outgoing beam has a coherent distance shorter than twice an optical distance between front and back surfaces of the plate-like sample, can be used as the light source so as to be able to eliminate noise arising from the light reflected from any surfaces other than the sample surface; and the shape measurement means can have a path match route section that divides the outgoing beam from the light source into two beams, causes one of the two beams to make a detour, in relation to the other of the two beams, by an amount corresponding to an optical path length, and that merges the two beams into a single beam so as to output the single beam.

In the method and apparatus for measuring holding distortion according to the present invention, there are carried out first and second measurement operations for measuring the shapes of front and back surfaces of a sample held in a held state, and a third measurement operation for measuring the shape of the front or back surface by holding the sample in such a way that inverse distortion arises in the sample.

By means of the first measurement operation, front surface shape data generated as a result of holding distortion being superimposed on the front surface shape are obtained. By means of the second measurement operation, back surface shape data generated as a result of the holding distortion being superimposed on the back surface shape are obtained. By means of the third measurement operation, there are obtained front surface shape data generated as a result of inverse distortion being superimposed on the front surface shape or back surface shape data generated as a result of the inverse distortion being superimposed on the back surface shape.

Moreover, first data pertaining to the variation in the thickness of the sample are obtained on the basis of the front surface shape data obtained through the first measurement operation and the back surface shape data obtained through the second measurement operation. Second data generated as a result of the holding distortion and the inverse distortion being superimposed on the variation in thickness are obtained on the basis of the front surface shape data obtained through the first measurement operation and the back surface shape data obtained through the third measurement operation, or on the basis of the back surface shape data obtained through the second measurement operation and the front surface shape data obtained through the third measurement operation.

The inverse distortion is opposite in orientation and essentially equal in amount of deformation to the holding distortion arising in the sample due to the held state. Accordingly, the inverse distortion can be handled as data pertaining to the amount of distortion which differs from the holding distortion only in terms of orientation. Therefore, on the basis of the first and second data, the holding distortion can be determined while being isolated from the shapes of the front and back surfaces of the sample. On the basis of measurement data pertaining to the thus-determined holding distortion, the shapes of the front and back surfaces of the sample, or the like, which are free from holding distortion, can be measured with high accuracy.

BRIEF DESCRIPTION OF THE DRAWINGS

FIGS. 2A and 2B are diagrams showing the configuration of the sample holding apparatus shown in FIG. 1;

DETAILED DESCRIPTION OF THE INVENTION

Figure 1:
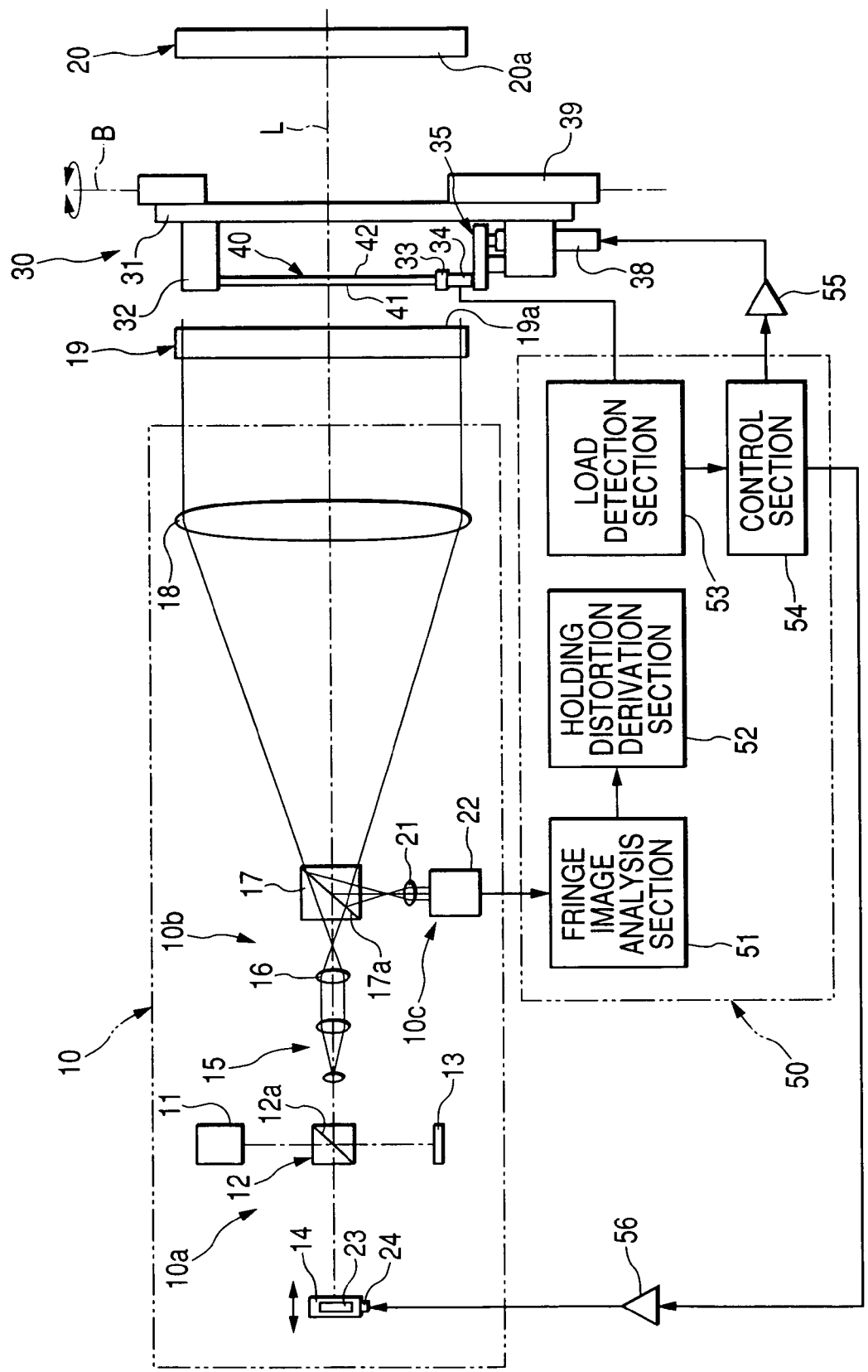
FIG. 1 is a diagrammatic block diagram of a holding direction measurement apparatus according to an illustrating, non-limiting embodiment of the present invention.

Exemplary embodiments of the present invention will be described in detail hereunder by reference to the drawings. FIG. 1 is a diagrammatic block diagram of a holding distortion measurement apparatus according to an exemplary embodiment of the present invention; and FIG. 2 is a diagrammatic diagram of a sample-holding apparatus shown in FIG. 1. FIG. 2A is a front view of the sample-holding apparatus, and FIG. 2B is a side view of the same.

<Apparatus Configuration>

A holding distortion measurement apparatus shown in FIG. 1 is for measuring a surface shape or a distribution of internal refraction factor of a sample 40, such as a photomask, in a clean room or the like. The holding distortion measurement apparatus includes an interferometer 10 as an exemplary example of shape measurement means, a transmissive reference plate 19, a reflective reference plate 20, a sample-holding device 30 serving as an exemplary example of holding means, and a computer 50 serving as an exemplary example of analyzing means.

The interferometer 10 includes a path match route section 10a for adjusting an optical path length of a measurement beam; an interference optical system 10b for acquiring an interference fringe; and an imaging system 10c for imaging the thus-acquired interference fringe. The path match route section 10a has a beam splitter 12, and two mirrors 13, 14. A beam output from a light source 11 is split into two beams by a half mirror surface 12a of the beam splitter 12. The path match section 10a is configured such that the thus-split two beams are reflected in opposite directions by the mirrors 13, 14, to thus return to the beam splitter 12; such that portions of the beams are merged into a single beam by the half mirror surface 12a; and such that the thus merged single beam is emitted toward the interference optical system 10b as a measurement beam.

In the path match route section 10a, the mirror 14 is retained by a uniaxial stage 23 so as to be movable in the horizontal direction (i.e., the direction of the optical axis L) in the drawing. A path length difference between a round-trip path (hereinafter called a "first path") between a branch point on the half mirror surface 12a and the mirror 14 and another round-trip path (hereinafter called a "second path") between the branch point and the mirror 13 can be adjusted by changing the position of the mirror 14 by means of actuation of the uniaxial stage 23 by means of an actuator 24. In the present embodiment, one beam passing through the first path is configured so as to make a detour (travel a longer way) in relation to the other beam passing through the second path, by the amount corresponding to an optical path length.

The light source 11 is formed from a low coherent light source set such that a coherence distance of an outgoing beam output as a measurement beam becomes shorter than twice the optical distance between the front and back surfaces of the ample 40. The low coherence light source can be a general low coherent light source, such as an LED, an SLD, a halogen lamp, a high-pressure mercury lamp, or the like, or a wavelength modulation light source, which is adjusted to have a coherence distance equivalent to a coherence distance of the low coherent light source when an image of an interference fringe is captured by the imaging element. A wavelength modulation light source of this type modulates the wavelength of the light emitted from the light source (a semiconductor laser light source (LD) is usually used) within a period of time shorter than a response time of the imaging element (a light storage time), and images an interference fringe in a time-averaged manner within the response time of the imaging element, thereby obtaining a result equivalent to that achieved when a light source, which emits light having a wide spectrum width and a short coherence distance, is employed. A technique for composing a coherent function is disclosed in, e.g., Proceedings of Light Wave Sensing May, 1995, pp. 75 to 82. An improved technique based on that technique is also disclosed (JP-A-2004-37165).

The interference optical system 10b has a beam expander 15, a convergent lens 16, a beam splitter 17, and a collimator lens 18, which are arranged in sequence of propagation of the measurement beam emitted from the path match route section 10a. The imaging system 10c has an image formation lens 21 and an imaging camera 22, which are disposed below the beam splitter 17 in the drawing. The interference optical system 10b constitutes a Fizeau optical system along with the transmissive reference plate 19 and the reflective reference plate 20. An interference fringe, which is formed from reference light reflected from a reference plane 19a of the transmissive reference plate 19 and subject light returning from the sample 40 after having passed through the reference plane 19a, is formed into an image on an imaging element, such as a CCD, CMOS, or the like, in the imaging camera 22 by way of a half mirror face 17a of the beam splitter 17 and the image formation lens 21.

Although not illustrated, the transmissive reference plate 19 is provided with a fringe scan adapter for accomplishing micromotion of the transmissive reference plate 19 in the direction of an optical axis L when fringe scan measurement is performed; and a tilt adjustment mechanism for finely adjusting an inclination of the sample 40 held by the sample-holding device 30 with respect to the reference plan 19a. The reflective reference plate 20 is provided with a similar tilt adjustment mechanism.

As shown in FIGS. 2A and 2B, the sample-holding device 30 includes a back-plate section 31 in which an opening section 31a used for measuring a transmitted wave surface is formed; a pair of upper and lower support members for supporting the sample 40 (an upper support member 32 and a lower support member 33); a pair of right and left load cells 34, 34 for detecting the load acting on the sample 40; and a load-imparting mechanism for imparting a predetermined load on the supported sample 40. The load-imparting mechanism comprises a movable plate 35; a pair of right and left linear guide sections 36, 36; a fixed plate 37; and a linear actuator 38 actuated by a driving driver 55 shown in FIG. 1. The sample-holding device 30 also has an inversion mechanism 39 (for the sake of convenience, only vertically-separated pillar sections thereof are illustrated; the same applies to FIGS. 2A and 2B). By means of this inversion mechanism 39, the sample-holding device 30 can be inverted through 180 degrees around an axis B while holding the sample 40.

The support members 32, 33 shown in FIGS. 2A and 2B are configured to vertically come into contact with the sample 40 from both sides with a normal line C of the plane of the sample 40 interposed therebetween, to thus hold the sample 40 such that the normal line C becomes substantially perpendicular to the direction of gravity (the vertical direction in the drawing). Although omitted from the drawings, the support members 32, 33 are provided with press members which are provided in positions in the vicinity of the front or back surface or side surface of the sample 40 for preventing tilting of the sample 40. A material which is less likely to generate dust; e.g., a PEEK material (PEEK: polyether etherketone), is preferably used for the support members 32, 33 and the press members.

The fixed plate 37 is fastened to the backing-plate section 31, and the pair of linear guide sections 36, 36 and the linear actuator 38 are held by the fixed plate 37. Each of the pair of linear guide sections 36, 36 is formed into a tubular shape, by means of which the respective linear guide sections 36, 36 slidably engage with a pair of pin sections 35a, 35a provided on the lower surface of the movable plate 35; and the pair of linear guide sections 36, 36 guide the movable plate 35 so as to be able to vertically reciprocate.

The linear actuator 38 is configured such that an extremity section 38a actuated so as to linearly reciprocate presses the movable plate 35 along a line of action D shown in FIG. 2B. In the present embodiment, the linear actuator 38 is arranged such that the line of action D passes through a position, which is separated, by a distance, from the position where the support member 33 contacts the sample 40 in a direction (the right direction in the drawing) along the normal line C, and becomes substantially perpendicular to the normal line C. As a result, when the extremity section 38a of the linear actuator 38 presses the movable plate 35 along the line of action D, the force for pressing the sample 40 from both vertical sides thereof and a moment which causes predetermined distortions in the sample 40 (preferably distortions (deformations due to bending) symmetrical about the axis B of inversion) act on the sample 40 by way of the movable plate 35, the pair of load cells 34, 34, and the pair of support members 32, 33.

The pair of load cells 34, 34 are interposed between the lower support member 33 and the movable plate 35. The load cells 34, 34 are configured to detect the vertical load exerted on the sample 40 by the linear actuator 38 and output a detected signal to a load detection section 53 shown in FIG. 1. As shown in FIG. 2A, the linear actuator 38 and the pair of load cells 34, 34 are disposed below the sample 40 so as to be able to diminish the possibility of dust, which is generated as a result of actuation of the linear actuator and the load cells, adhering to the sample plane.

As shown in FIG. 1, the computer 50 includes a fringe image analysis section 51 constituted of a microprocessor, various memory devices, arithmetic processing programs stored in the memory devices, and the like; a holding distortion derivation section 52, the load detection section 53, and a control section 54. Further, a monitor device for displaying an obtained image of an interference fringe, or the like, and an input device for effecting input operations with respect to the computer 50 (neither the monitor device nor the input device is illustrated) are connected to the computer 50. The control section 54 is configured to adjust the position of the mirror 14 by means of controlling the amount of actuation of the actuator 24 by way of the driving driver 56 as well as to adjust the load imposed on the sample 40 by means of controlling the amount of actuation of the linear actuator 38 by way of the driving driver 55 according to a load value fed back from the load detection section 53.

<Method for Measuring Holding Distortion>

Figure 3A:
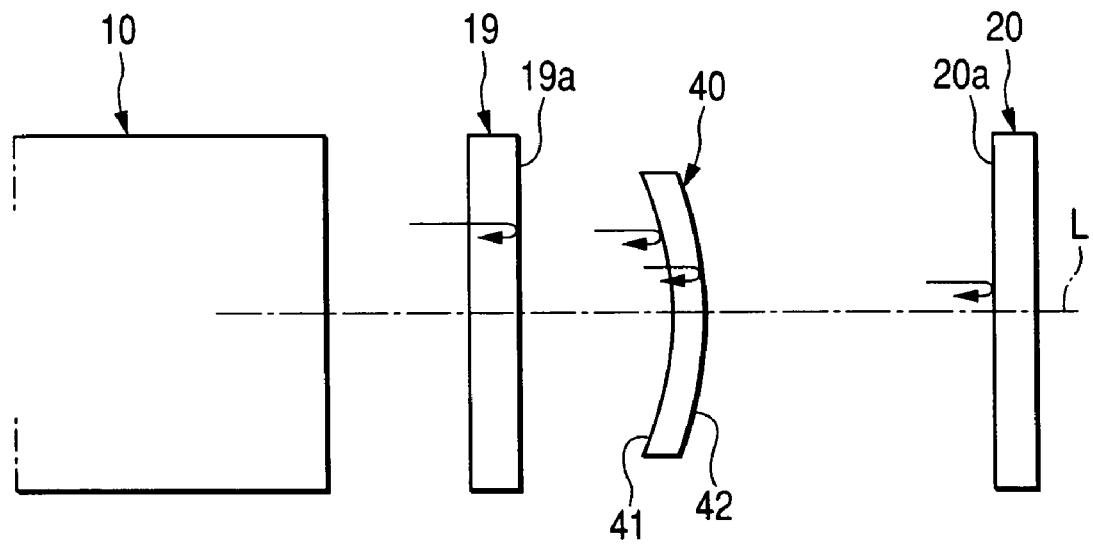
FIGS. 3A and 3B are diagrammatic views showing a first illustrating, non-limiting embodiment of a method for measuring holding distortion according to the present invention.
Figure 3B:
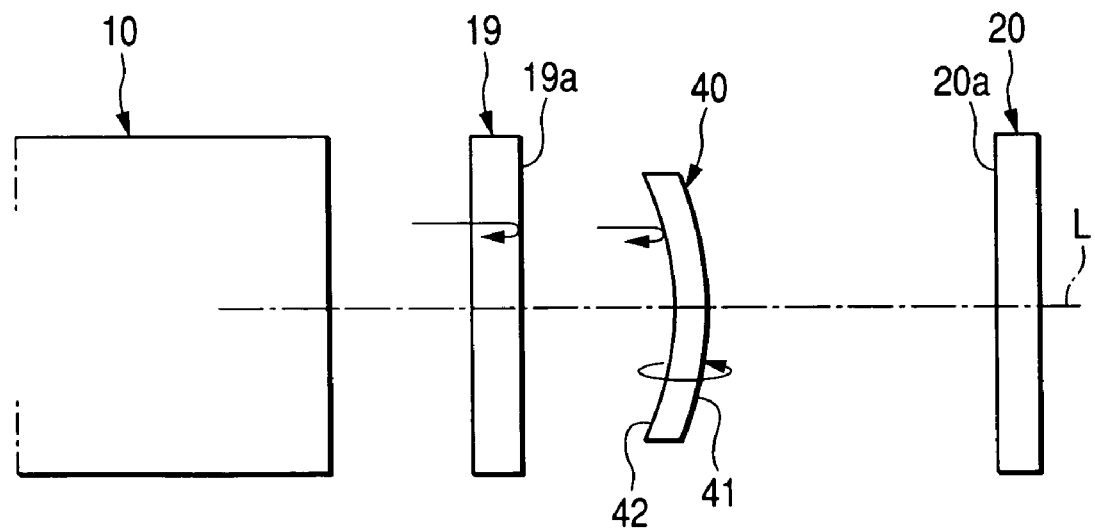

There will now be described a method for measuring holding distortion according to an exemplary embodiment of the present invention (hereinafter called a "method of a first embodiment"). FIGS. 3A and 3B are views for diagrammatically showing the method of the first embodiment. FIG. 3A shows practice of first and second measurement operations of the present invention, and FIG. 3B shows practice of a third measurement operation of the present invention.

Under the method of the first embodiment, the first, second, and third measurement operations of the present invention are performed through use of the above-described holding distortion measurement apparatus. When measurement operations are performed, the path match route section 10a shown in FIG. 1 adjusts the path length of the measurement beam, for the following reasons.

Specifically, the sample 40 is formed from a substance which is transparent to the measurement beam. A front surface 41 and a back surface 42 of the sample are formed into flat plates which are substantially parallel to each other. Therefore, the light returning from the sample 40 to the reference face 19a includes first returning light which is reflected from the front surface 41 of the sample 40 after having passed through the reference plane 19a, second returning light which is reflected by the back surface 42 after the light has entered the sample 40 by way of the front surface 41; and third returning light which passes through the sample 40, undergoes reflection on the reflection reference plane 20a of the reflective reference plate 20, and again passes through the sample 40.

As will be described later, the surface 41 of the sample 40 is determined as the sample surface during the first measurement, and hence the first returning light is taken as sample light. During the second and third measurements, the back surface 42 of the sample 40 is taken as a sample surface, and hence the second returning light is taken as sample light. Although the surface of the wave having passed through the sample 40 is also measured under the method of the first embodiment the third returning light is taken as sample light during measurement. At that time, what is required in, e.g., the first measurement, is information about an interference fringe resulting from interference of the first returning light with the reference light. When interference has arisen between the reference light and the second and third returning light beams or between the respective returning light beams, the interference will become noise and adversely affect the accuracy of measurement.

For these reasons, when each measurement is performed, the path match route section 10a shown in FIG. 1 adjusts the optical path length difference between the above-described first and second paths so as to coincide with the optical path length difference between the reference light and the sample light in the interference optical system 10b, within the range of the coherent interference distance of the light source 11. As a result, only the required interference arises, and unwanted interference is prevented from arising. When the third returning light is not taken as the sample light, the reflective reference plate 20 is tilted, or a shutter is interposed between the reflective reference plate 20 and the sample 40. By means of this shutter, the third returning light may be prevented from being reflected toward the transmissive reference plate 19 by means of interrupting the optical path between the reflective reference plate 20 and the sample 40.

Procedures of the first embodiment method will now be described on the assumption that the above-described path length adjustment is carried out for each measurement.

(Step S1) Through use of the sample holding device 30 shown in FIGS. 2A and 2B, the pair of support members 32, 33 are brought into contact with the sample 40 from both vertical sides thereof with the normal line C of the surface of the sample 40 interposed therebetween, thereby arranging the sample 40 such that the normal line C becomes essentially perpendicular to the direction of gravity. At this time, adjustment is performed through use of an unillustrated tilt adjustment mechanism such that the reference plane 19a of the transmissive reference plate 19 and the surface 41 of the sample 40 become essentially parallel to each other.

(Step S2) The linear actuator 38 is actuated, to thus impose a load on the support members 32, 33 by way of the movable member 35 and the pair of load cells 34, 34, whereby the sample 40 is held in a held state. At this time, holding distortion attributable to this held state of the sample arises in the sample 40 (for the sake of convenience, the distortion is illustrated as a recess in the front surface 41 of the sample 40 and a protuberance in the back surface 42 of the same in FIG. 3A).

Figure 7:
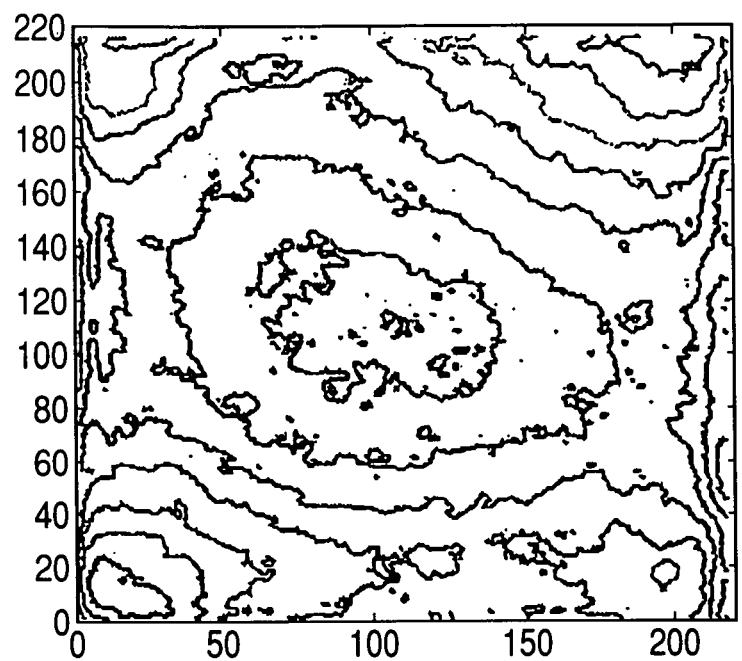
FIG. 7 is a view showing an example measurement result of front surface shape data of a sample.

(Step S3) The first measurement of the present invention; i.e., shape measurement of the front surface 41 of the sample 40 held in the held state, is carried out by the use of the interferometer 10 and the computer 50, both of which are shown in FIG. 1, to thus acquire front surface shape data $\phi_1(x, y)$ pertaining to the sample 40 (hereinafter described simply as "$\phi_1$") (An example measurement result is shown in FIG. 7.) Numerals in the drawing denote numbers assigned to pixels, and the same also applies to any counterparts in the following descriptions in relation to FIGS. 8 to 11). In this front surface shape data $\phi_1$, the above-described holding distortion $U_1(x, y)$ (hereinafter described simply as "$U_1$") is superimposed on the surface shape data $P(x, y)$ (hereinafter described simply as "P") pertaining to the surface 41 o the sample 40. Accordingly, the front surface shape data $\phi_1$ can be expressed by Equation (1) provided below.

$$\phi_1 = P + U_1 \quad (1)$$

(Step S4) The second measurement of the present invention; i.e., shape measurement of the back surface 42 of the sample 40 held in the held state, is performed while the sample 40 is held in the held state. Back surface shape data $\phi_2(x, y)$ (hereinafter described simply as "$\phi_2$"), which will be acquired when the back surface 42 of the sample 40 is viewed from the direction of the front surface 41, is determined. In this back surface shape data $\phi_2$, the above-described holding distortion $U_1(x, y)$ (hereinafter described simply as "$U_1$") and transmitted wave surface information $R(x, y)$ (hereinafter described simply as "R") showing the distribution of refraction factor of the sample 40 are superimposed on the shape information $Q(x, y)$ (hereinafter described simply as "Q") that are acquired when the back surface 42 of the sample 40 is viewed from the direction of the front surface 41. The back surface shape data $\phi_2$ can be expressed by Equation (2) provided below.

$$\phi_2 = Q + R + U_1 \quad (2)$$

(Step S5) Information R about the surface of the wave having transmitted through the sample 40, for which the third light returning from the reflective reference plane 20a is taken as sample light while the sample 40 is maintained in the held state, is determined.

Figure 8:
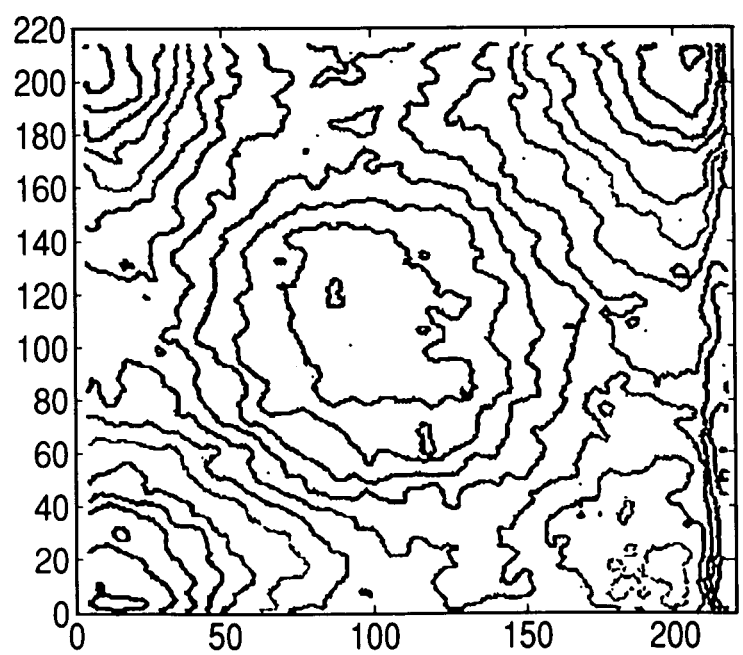
FIG. 8 is a view showing an example measurement result of first data.

(Step S6) First data $D_1(x, y)$ (hereinafter described simply as "$D_1$") pertaining to variations in the thickness of the sample 40 (P–Q)(x, y) (hereinafter described simply as "P–Q") are determined by Equation (3) provided below, on the basis of the front surface shape data $\phi_1$ obtained in step S3, the back surface shape data $\phi_2$ obtained in step S4, and the information R about the surface of the transmitted wave obtained in step S5 (one example measurement result is shown in FIG. 8).

$$D_1 = \phi_1 - \phi_2 + R = P - Q \quad (3)$$

(Step S7) The sample 40 is temporarily released from the held state, and the sample 40 is re-arranged upside-down. Subsequently, a load identical with that employed in step S2 is imposed on the sample 40 through use of the sample-holding device 30 shown in FIG. 2A and 2B, to thus hold the sample 40. At this time, inverse distortion, whose orientation is opposite that of distortion of the front or back surface of the holding distortion and whose degree is substantially identical with that of the holding distortion arises in the sample 40 (for the sake of convenience, in FIG. 3B the back surface 42 of the sample 40 is illustrated as being recessed, and the front surface 41 of the same is illustrated as protuberant).

(Step S8) The third measurement of the present invention; i.e., shape measurement of the back surface 42 of the sample 40 held so as to cause the above-described inverse distortion, is carried out, to thus determine the back surface shape data $\phi_3(x, y)$ (hereinafter described simply as "$\phi_3$") pertaining to the sample 40. In this back surface shape data $\phi_3$, the inverse distortion $U_2(x, y)$ (hereinafter described simply as "$U_2$") is superimposed on shape information $Q'(x, y)$ (hereinafter described simply as "$Q'$") which is acquired when the back surface 42 of the sample 40 is viewed from the direction of the position of the back surface 42, and hence the back surface shape data $\phi_3$ can be expressed by Equation (4) provided below.

$$\phi_3 = Q' + U_2 \quad (4)$$

Figure 9:
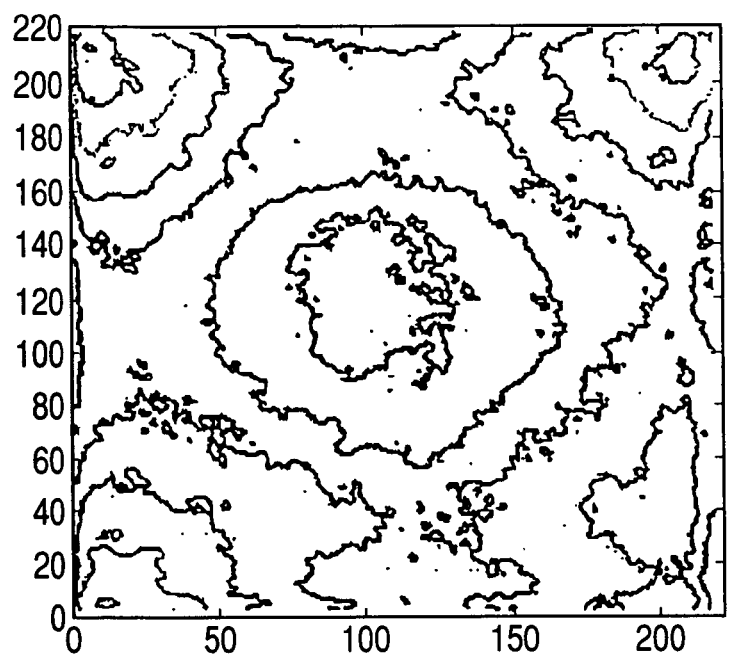
FIG. 9 is a view showing an example measurement result of surface shape data of a sample.

(Step S9) The back surface shape data $\phi_3$ obtained in step S8 are subjected to coordinate conversion processing such that the sample 40 becomes inverted, to thus determine inverted back surface shape data $r\phi_3(x, y)$ (hereinafter described simply as "$r\phi_3$," where "r" means inversion; and the same also applies to any counterparts in the descriptions provided below) (an example measurement result is shown in FIG. 9). The shape information $Q'$ is inverted to thus become essentially equal to the shape information $Q$ ($rQ'=Q$). The inverse distortion $U_2$ is inverted to thus become essentially equal to the holding distortion $U_1$ whose sign is inverted from positive to negative, or vice versa ($rU_2 = -U_1$). Hence, the inverted back surface shape data $r\phi_3$ can be expressed by Equation 5 provided below.

$$r\phi_3 = rQ' + rU_2 = Q - U_1 \quad (5)$$

Figure 10:
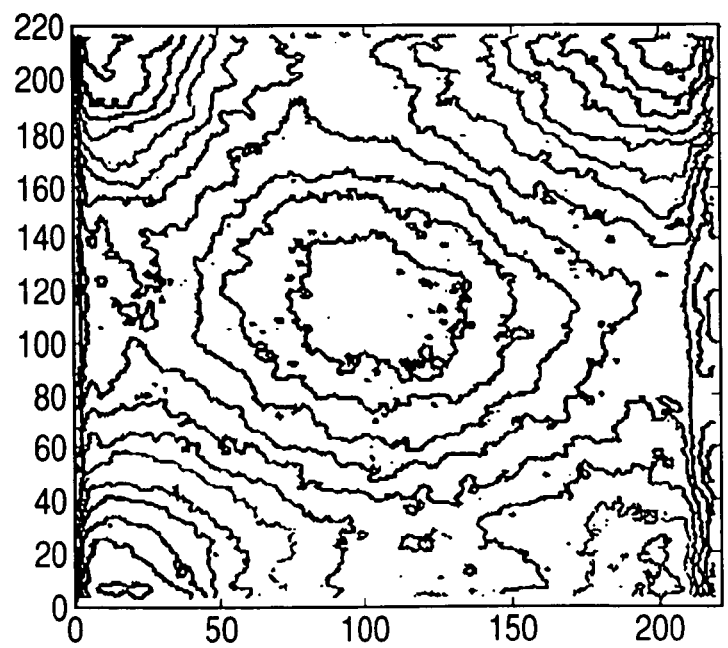
FIG. 10 is a view showing an example measurement result of second data.

(Step S10) Second data $D_2(x, y)$ (hereinafter described simply as "$D_2$") obtained as a result of superimposing twice the holding distortion $U_1$ on variations P–Q in the thickness of the sample 40 are determined, by Equation (6) provided below, on the basis of the front surface shape data $\phi_1$ obtained in step S3 and the back surface shape data $\phi_3$ obtained in step S9 (an example measurement result is shown in FIG. 10).

$$D_2 = \psi_1 - r\psi_3 = P - Q + 2U_1 \quad (6)$$

Figure 11:
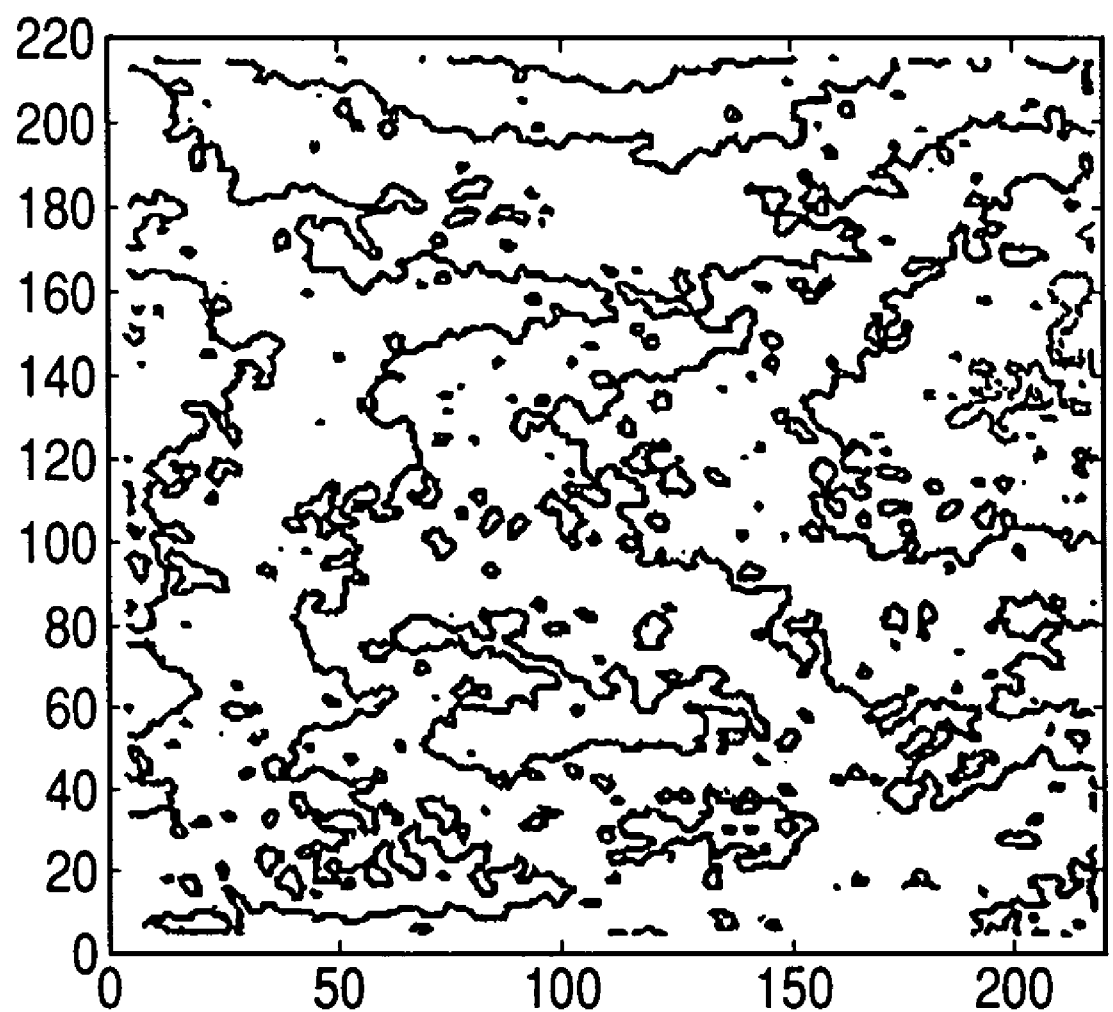
FIG. 11 is a view showing an example measurement result of holding distortion.

(Step S11) The holding distortion $U_1$ is determined on the basis of the first data $D_1$ obtained in step S6 and the second data $D_2$ obtained in step S10, by means of Equation (7) provided below (an example measurement result is shown in FIG. 11).

$$U_1 = (D_2 - D_1) \div 2 \quad (7)$$

(Step S12) The shape P of the surface 41 of the sample 40, which is free from the holding distortion $U_1$, is determined, by Equation (8) provided below, on the basis of the holding distortion $U_1$ obtained in step S11 and the front surface shape data $\phi_1$ obtained in step S3.

$$P = \phi_1 - U_1 \quad (8)$$

The shape Q of the back surface 42 of the sample 40, which is free from the holding distortion $U_1$, can also be determined on the basis of the holding distortion $U_1$ and the back surface shape data 42 obtained in step S4.

As mentioned above, according to the method of the first embodiment, when the parallel flat-plate-like sample 40, which is transparent to the measurement beam, is held by the sample-holding device 30 in the held state, the holding distortion $U_1$ arising in the sample 40 for reasons of the held state can be determined while being isolated from the shapes of the front and back surfaces of the sample 40. On the basis of the measured data pertaining to the thus-determined holding distortion $U_1$, the shapes P, Q of the front and back surfaces of the sample 40, which are free from the holding distortion $U_1$, can be measured with high accuracy.

<Modification to Mode>

Figure 4A:
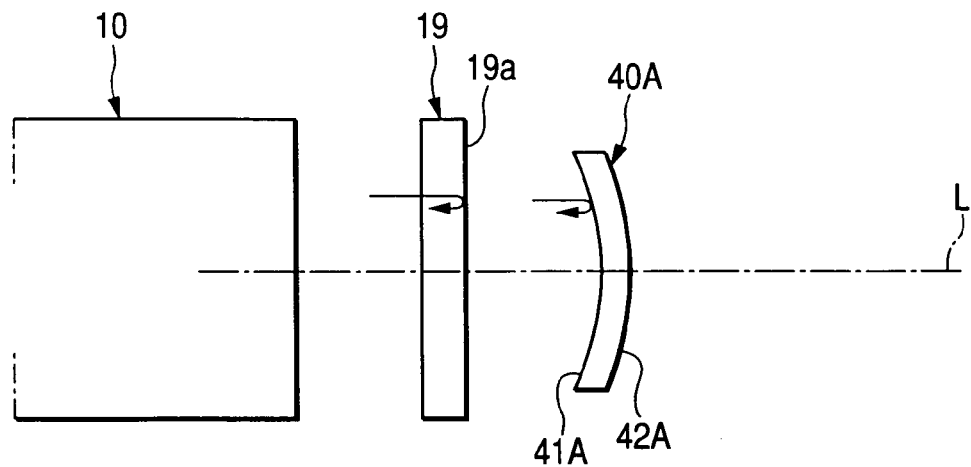
FIG. 4A to 4C are diagrammatic views showing a second illustrating, non-limiting embodiment of the method for measuring holding distortion according to the present invention.
Figure 4B:
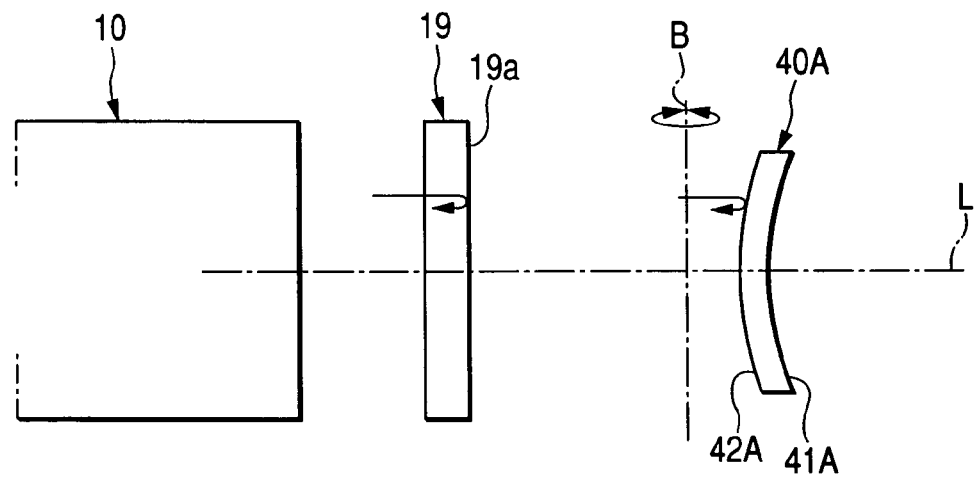
Figure 4C:
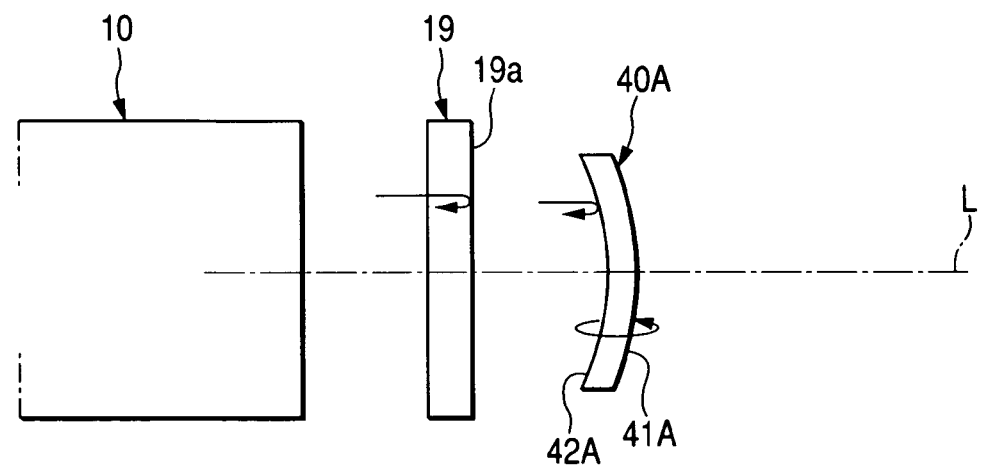

There will now be described a method for measuring holding distortion according to another exemplary embodiment of the present invention (hereinafter called a "method of a second embodiment"). FIGS. 4A to 4C are views for diagrammatically showing the second embodiment method. FIG. 4A shows practice of a first measurement operation of the present invention; FIG. 4B shows practice of a second measurement operation of the present invention; and FIG. 4C shows practice of a third measurement operation of the present invention.

The method of the second embodiment is analogous to the method of the first embodiment in that the first, second, and third measurement operations of the present invention are carried out by use of the above-described holding distortion measurement apparatus. However, a sample 40A is opaque to the measurement beam. Therefore, the second embodiment method differs from the first embodiment method in that measurement of the surface of the wave having transmitted through the sample 40A, which is carried out in the first embodiment method, is not performed. Since the sample 40A is opaque, a high coherent light source, such as the laser light source, can be used. In that case, there is no necessity for effecting adjustment of a path length, which is carried out in each measurement under the method of the first embodiment. By means of the second embodiment method, the sample 40 that is transparent to the measurement beam can also be measured. In such a case, as in the case of the method of the first embodiment, a low coherent light source is used, and adjustment of a path length and measurement of the surface of the wave having passed through the sample 40 are carried out in each measurement. Procedures of the method of the second embodiment will be described hereinbelow.

(Step T1) As in the case of steps S1, S2 of the method of the first embodiment, a load is imposed on the sample 40A by use of the sample-holding device 30 shown in FIGS. 2A and 2B, whereby the sample 40A is held in a held state. At this time, holding distortion attributable to the held state arise in the sample 40A (for the sake of convenience, in FIG. 4A, a front surface 41A of the sample 40A is shown as a recess, and a back surface 42A of the same is shown as a protuberance).

(Step T2) First measurement of the present invention; i.e., measurement of a shape of the surface 41A of the sample 40A held in the held state, is carried out, thereby determining front surface shape data $\psi_1(x, y)$ (hereinafter described simply as "$\psi_1$") pertaining to the sample 40A. In this front surface shape data $\psi_1$, holding distortion $W_1(x, y)$ (hereinafter described simply as "$W_1$") is superimposed on shape information $K(x, y)$ (hereinafter described simply as "K") about the front surface 41A of the sample 40A, and hence the front surface shape data $\psi_1$ can be expressed by Equation (9) provided below.

$$\psi_1 = K + W_1 \quad (9)$$

(Step T3) As shown in FIG. 4B, the sample-holding device 30 is rotated around the axis B while the sample 40A is held in a held state by the sample-holding device 30, to thus invert the sample 40A. In this state, the second measurement of the present invention; i.e., shape measurement of the back surface 42A of the sample 40A held in the held state, is carried out, to thus determine back surface shape data $\psi_2(x, y)$ (hereinafter described simply as "$\psi_2$") that are acquired when the back surface 42A of the sample 40A is viewed from the direction of the back surface 42A. In the back surface shape data $\psi_2$, $rW_1$ obtained by inversion of the holding distortion $W_1$ is superimposed on shape information J' which is obtained when the back surface 42A of the sample 40A is viewed from the direction of the back surface 42A. The back surface shape data $\psi_2$ can be expressed by Equation (10) provided below.

$$\psi_2 = J' + rW_1 \quad (10)$$

(Step T4) The back surface shape data $\psi_2$ obtained in step T3 are subjected to coordinate conversion processing which inverts the sample 40A, to thus determine inverted back surface shape data $r\psi_2(x, y)$ (hereinafter described simply as "$r\psi_2$.") The shape information J' is inverted to thus become essentially equal to the shape information $J(x, y)$ (hereinafter described simply as "J") (rJ'=J) which is acquired when the back surface 42A of the sample 40A is viewed from the direction of the front surface 42A When $rW_1$ resulting from inversion of the holding distortion $W_1$ is further inverted, the result becomes equal to $W_1$ ($rrW_1 = W_1$). Accordingly, the inverted back surface shape data $\psi_2$ can be expressed by Equation (11) provided below.

$$r\psi_2 = rJ' + rrW_1 = J + W_1 \quad (11)$$

(Step T5) First data $E_1(x, y)$ (hereinafter described simply as "$E_1$") pertaining to variations in the thickness of the sample 40A (K−J)(x, y) (hereinafter described simply as "K−J") are determined, on the basis of the front surface shape data $\psi_1$ obtained in step $T_2$ and the back surface shape data $r\psi_2$ obtained in step T4, by Equation (12) provided below.

$$E_1 = \psi_1 - r\psi_2 = K - J \quad (12)$$

(Step T6) The sample-holding device 30 shown in FIG. 2 is rotated around the axis B to thus return to its original position. The sample 40A is temporarily released from the held state, and the sample 40A is inverted to be re-arranged. Subsequently, a load analogous to that employed in step T1 is imposed on the sample 40A, and this sample 40A is held. At that time, inverse distortion, whose orientation is opposite that of distortion of the front or back surface of the sample 40A and whose degree is substantially identical with that of the holding distortion (for the sake of convenience, in FIG. 4C, the back surface 42A of the sample 40A is depicted as being recessed, and the front surface 41A of the same is depicted as being protuberant), arises in the sample 40A.

(Step T7) The third measurement operation of the present invention; i.e., shape measurement of the back surface 42A of the sample 40A held so as to cause the above-described inverse distortion, is carried out, to thus determine the back surface shape data $\psi_3(x, y)$ (hereinafter described simply as "$\psi_3$") pertaining to the sample 40A. In this back surface shape data $\psi_3$, the inverse distortion $W_2(x, y)$ (hereinafter described simply as "$W_2$") is superimposed on shape information J' which is acquired when the back surface 42A of the sample 40A is viewed from the direction of the position of the back surface 42A, and hence the back surface shape data $\psi_3$ can be expressed by Equation (13) provided below.

$$\psi_3 = J' + W_2 \quad (13)$$

(Step T8) The back surface shape data $\psi_3$ obtained in step T7 are subjected to coordinate conversion processing such that the sample 40A becomes inverted, to thus determine inverted back surface shape data $r\psi_3(x, y)$ (hereinafter described simply as "$r\psi_3$"). The shape information J' is inverted to thus become essentially equal to the shape information J ($rJ' = J$). The inverse distortion $W_2$ is inverted to thus become essentially equal to the holding distortion $W_1$ whose sign is inverted from positive to negative, or vice versa ($rW_2 = -W_1$). Hence, the inverted back surface shape data $r\psi_3$ can be expressed by Equation (14) provided below.

$$r\psi_3 = rJ' + rW_2 = J - W_1 \quad (14)$$

(Step T9) Second data $E_2(x, y)$ (hereinafter described simply as "$E_2$") obtained as a result of superimposing twice the holding distortion $W_1$ on variations K−J in the thickness of the sample 40A are determined, by Equation (15) provided below, on the basis of the front surface shape data $\psi_1$ obtained in step T2 and the back surface shape data $r\psi_3$ obtained in step T8.

$$E_2 = \psi_1 - r\psi_3 = K - J + 2W_1 \quad (15)$$

(Step T10) The holding distortion $W_1$ is determined on the basis of the first data $E_1$ obtained in step T5 and the second data $E_2$ obtained in step T9, by means of Equation (16) provided below.

$$W_1 = (E_2 - E_1) \div 2_1 \quad (16)$$

(Step T11) The shape K of the front surface 41A of the sample 40A, which is free from the holding distortion $W_1$, is determined, by Equation (17) provided below, on the basis of the holding distortion $W_1$ obtained in step T10 and the front surface shape data $\psi_1$ obtained in step T2.

$$K = \psi_1 - W_1 \quad (17)$$

The shape J of the back surface 42A of the sample 40A, which is free from the holding distortion $W_1$, can also be determined on the basis of the holding distortion $W_1$ and the back surface shape data $\psi_2$ obtained in step T3.

As mentioned above, according to the method of the second embodiment, when the parallel flat-plate-like sample 40A, which is transparent to the measurement beam, is held by the sample-holding device 30 in the held state, the holding distortion $W_1$ arising in the sample 40A for reasons of the held state can be determined while being isolated from the shapes of the front and back surfaces of the sample 40A. On the basis of the measured data pertaining to the thus-determined holding distortion $W_1$, the shapes K, J of the front and back surfaces of the sample 40A, which are free from the holding distortion $W_1$, can be measured with high accuracy.

Figure 5:
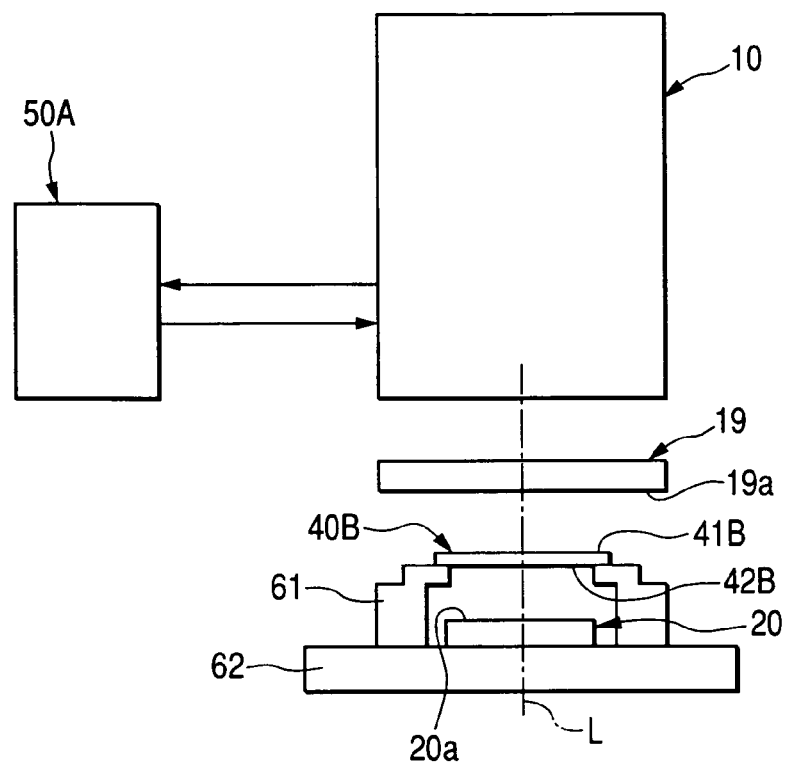
FIG. 5 is a diagrammatic view showing another illustrating, non-limiting embodiment of an apparatus for measuring holding distortion according to the present invention.

A holding distortion measurement apparatus according to another exemplary embodiment of the present invention will now be described. FIG. 5 is a diagrammatic block diagram of a holding distortion measurement apparatus according to another embodiment of the present invention. In FIG. 5, constituent members analogous to those of the device shown in FIG. 1 are assigned the same reference numerals as those used in FIG. 1, and their detailed explanations are omitted.

The holding distortion measurement apparatus shown in FIG. 5 is for measuring a surface shape or a distribution of internal refraction factor of a sample 40B, such as a photomask, in a clean room or the like. The holding distortion measurement apparatus is constituted of the interferometer 10 constituting the shape measurement means, the transmissive reference plate 19, the reflective reference plate 20, a sample-holding table 61 for holding the sample 40B in a predetermined held state, and a computer 50A.

Although not illustrated, the transmissive reference plate 19 is provided with a fringe scan adapter for accomplishing micromotion of the transmissive reference plate 19 in the direction of the optical axis L when fringe scan measurement is performed; and a tilt adjustment mechanism for finely adjusting an inclination of the sample 40B held by the sample-holding table 61 with respect to the reference plan 19a. The reflective reference plate 20 is placed on an optical surface plate 62 by way of a similar tilt adjustment mechanism. The sample-holding table 61 is provided with an inclination adjustment mechanism for adjusting an inclination of the held sample 40B.

The interferometer 10, which is placed in landscape orientation in FIG. 1, is positioned in portrait orientation. The internal configuration of the interferometer 10 is identical with that shown in FIG. 1. Like the computer 50 shown in FIG. 1, the computer 50A comprises a fringe image analysis section and a holding distortion derivation section (omitted from the drawings), each of which is constituted of a microprocessor, various memory devices, and arithmetic processing programs stored in the memory devices. A monitor device for displaying an obtained image of an interference fringe, or the like, and an input device used for performing input operations for the computer 50A (neither the monitor device nor the computer are illustrated) are connected to the computer 50A.

As shown in FIG. 5, the sample-holding table 61 is configured to hold the sample 40B in an essentially horizontal position as well as to prevent occurrence of predetermined distortions, which would otherwise be caused in the sample 40B by action of gravity for reasons of the held state.

Figure 6A:
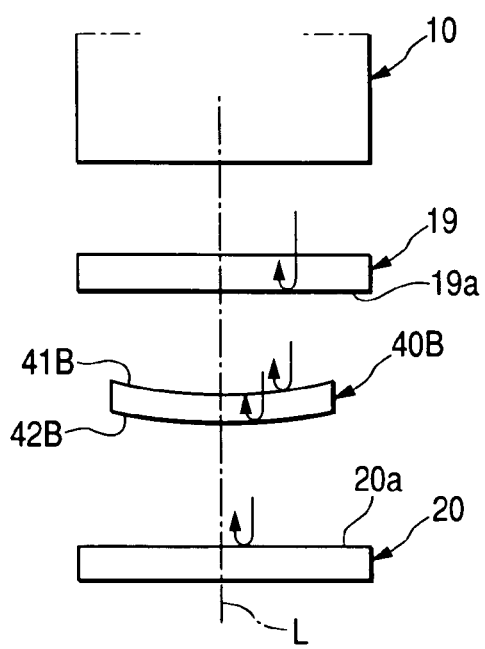
FIGS. 6A and 6B are diagrammatic views showing a third illustrating, non-limiting embodiment of the method for measuring holding distortion according to the present invention.
Figure 6B:
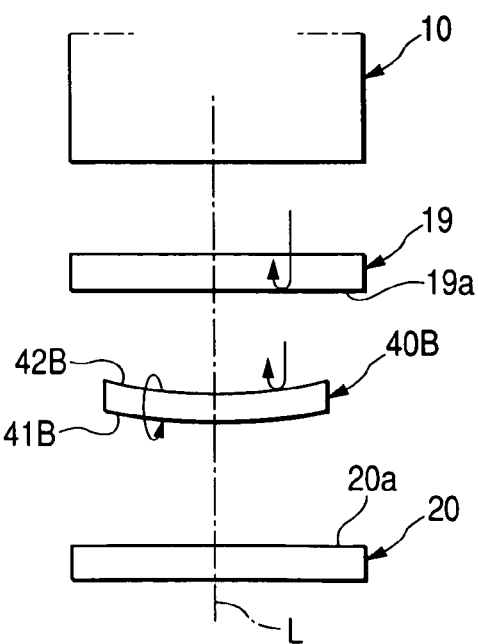

FIGS. 6A and 6B show an overview of the method for measuring holding distortion (hereinafter called "a method of a third embodiment") by use of the holding distortion measurement apparatus shown in FIG. 5. FIG. 6A shows practice of first and second measurement operations of the present invention, and FIG. 6B shows practice of a third measurement operation of the present invention.

Under the method of the third embodiment, the first, second, and third measurement operations of the present invention are performed through use of the above-described holding distortion measurement apparatus shown in FIG. 5. Procedures of the method of the third embodiment are the same as those of the previously-described method of the first embodiment. Specifically, a major difference between the first and third embodiment methods lies in that under the method of the first embodiment the sample 40 is held in an upright position by use of the sample-holding device 30 shown in FIGS. 2A and 2B and that under the method of the third embodiment the sample 40B is held in a horizontal position by use of the sample-holding table 61 shown in FIG. 5. So long as consideration is given to the fact that the above-described relationship between the holding distortion and the inverse distortion holds between the distortion arising in the sample 40b when the sample 40B is held with the front surface 41B thereof oriented upward and the distortion arising in the sample 40B when the sample 40B is held with the back surface 42B thereof oriented upward, the measurement procedures can be deemed to be analogous to those of the method of the first embodiment except for the difference in the held states, and therefore detailed explanations of the measurement procedures are omitted.

The above-described embodiments have not addressed errors in the system of the measurement apparatus. Such system errors include an error in the reference plate, an error in a bifurcating optical system, and the like. These errors are usually calibrated by use of a reference plate for calibration purpose. The calibration reference plate is subjected to absolute precision measurement according to a so-called three-surface-aligning method (see JP-A-9-203619 or the like) to thus determine a value, whereby errors in the calibration reference plate can be eliminated by a computer.

The embodiments of the method and apparatus for measuring holding distortion according to the present invention have been described. However, the present invention is not limited to these embodiments and is susceptible to various modifications.

For instance, under the above-described holding distortion measurement method, the shape of the back surface of the sample is measured through the third measurement operation. The front surface shape of the sample may be measured through the third measurement operation. In this case, second data are obtained on the basis of the back surface shape data obtained through the second measurement operation and the front surface shape data obtained through the third measurement operation.

The above-described holding distortion measurement apparatus has an interferometer serving as shape measurement means. In place of the interferometer, the holding distortion measurement apparatus may have a so-called moire apparatus or a light-section measurement apparatus.

Even when the interferometer is used as the shape measurement means, the layout of the interference optical system is not limited to an interference optical system of Fizeau type. The present invention can be applied to an interferometer having another optical system layout, such as a Michelson or Abramson grazing incidence interferometer, as well.

The optical system layout of the path match route section mentioned in the above embodiments is described as being analogous to the optical system layout of the Michelson interferometer. However, as described in JP-A-9-21606, one path may make a C-shaped detour with respect to the other path.

When the parallel plate-like sample, which is transparent to the measurement beam, is measured, the apparatus is preferably provided with a path match route section, because high-precision measurement becomes feasible. However, an opaque sample is measured with a measurement beam, the path match route section is unnecessary. The present invention is applicable even when the parallel plate-like sample, which is transparent to the measurement beam, is measured by means of an interferometer not having a path match route section.

Further, when a sample transparent to a measurement beam and another sample opaque to the measurement beam are measured by use of a single interferometer, the above-described low coherent light source and the high coherent light source, such as a laser light source, may be arranged in a switchable manner as the light source of the measurement beam. When the transparent sample is measured, measurement is carried out by use of the low coherent light source. When the opaque sample is measured, measurement may be carried out by use of the high coherent light source.

Measurement can be also carried out through use of a frequency conversion phase-shift interference measurement method described in JP-P-2004-510958.

It will be apparent to those skilled in the art that various modifications and variations can be made to the described preferred embodiments of the invention without departing from the spirit or scope of the invention. Thus, it is intended that the invention cover all modifications and variations of this invention consistent with the scope of the appended claims and their equivalents.

The present application claims foreign priority based on Japanese Patent Application No. JP2004-316788, filed Oct. 29, 2004, the contents of which is incorporated herein by reference.

What is claimed is:

1. A method for measuring a holding distortion arising in a plate-like sample due to a held state thereof when the plate-like sample is held in the held state, the method comprising:

performing a first measurement of a front surface shape of the plate-like sample held in the held state to obtain front surface shape data;

performing a second measurement of a back surface shape of the plate-like sample held in the held state to obtain back surface shape data;

performing a third measurement of at least one of: a front surface shape of the plate-like sample held in such a way that an inverse distortion arises in the plate-like sample, so as to obtain front surface shape data; and a back surface shape of the plate-like sample held in such a way that the inverse distortion arises in the plate-like sample, so as to obtain back surface shape data, wherein a deformation orientation of the inverse distortion is opposite that of the holding distortion, and a deformation amount of the inverse distortion is substantially equal to that of the holding distortion;

obtaining first data pertaining to a variation in thickness of the plate-like sample on the basis of front surface shape data obtained through the first measurement and back surface shape data obtained through the second measurement;

obtaining second data by superimposing data pertaining to the holding distortion and data pertaining to the inverse distortion on data pertaining to the variation in thickness, on the basis of one of: the front surface shape data obtained through the first measurement and the back surface shape data obtained through the third measurement; and the back surface shape data obtained through the second measurement and the front surface shape data obtained through the third measurement; and determining the holding distortion arising in the plate-like sample due to the held state on the basis of the first data and the second data.

2. The method for measuring a holding distortion according to claim 1, which comprises determining the front surface shape, which is free from the holding distortion, on the basis of the holding distortion determined and the front surface shape data obtained through the first measurement.

3. An apparatus for measuring a holding distortion arising in a plate-like sample due to a held state thereof when the plate-like sample is held in the held state, the apparatus comprising:

a shape measurement unit that performs:

a first measurement of a front surface shape of the plate-like sample held in the held state and along an optical axis of a measurement beam;

a second measurement of a back surface shape of the plate-like sample held in the held state and along the optical axis of the measurement beam; and a third measurement of at least one of: a front surface shape of the plate-like sample held along the optical axis of the measurement beam and held in such a way that an inverse distortion arises in the plate-like sample; and a back surface shape of the plate-like sample held along the optical axis of the measurement beam and held in such a way that the inverse distortion arises in the plate-like sample, wherein a deformation orientation of the inverse distortion is opposite that of the holding distortion, and a deformation amount of the inverse distortion is substantially equal to that of the holding distortion;

an analysis unit that:

obtains first data pertaining to a variation in thickness of the plate-like sample on the basis of front surface shape data obtained through the first measurement and back surface shape data obtained through the second measurement;

obtains second data by superimposing data pertaining to the holding distortion and data pertaining to the inverse distortion on data pertaining to the variation in thickness, on the basis of one of: the front surface shape data obtained through the first measurement and back surface shape data obtained through the third measurement; and the back surface shape data obtained through the second measurement and front surface shape data obtained through the third measurement; and determines the holding distortion arising in the plate-like sample due to the held state on the basis of the first data and the second data.

4. The apparatus for measuring a holding distortion according to claim 3, further comprising a holding unit capable of: holding the plate-like sample along the optical axis of the measurement beam; and inverting an orientation of the plate-like sample with respect to the shape measurement unit while the plate-like sample is maintained in the held state.

5. The apparatus for measuring a holding distortion according to claim 3, wherein the shape measurement unit comprises an interference optical system capable of acquiring an interference fringe carrying wave surface information about a surface of the plate-like sample by radiating an outgoing beam from a light source onto a reference surface and a sample surface of the plate-like sample held along the optical axis of the measurement beam so as to cause interference between light returning from the reference surface and light returning from the sample surface.

6. The apparatus for measuring a holding distortion according to claim 5, wherein the light source is a low coherent light source, in which the outgoing beam has a coherent distance shorter than twice an optical distance between front and back surfaces of the plate-like sample; and the shape measurement unit has a path match route section that: divides the outgoing beam from the light source into two beams; causes one of the two beams to make a detour, in relation to the other of the two beams, by an amount corresponding to a optical path length; and merges the two beams into a single beam so as to output the single beam.

* * * * *